United States Patent [19]

Juergens

[11] Patent Number: 4,948,436
[45] Date of Patent: Aug. 14, 1990

[54] THIN-FILM SOLAR CELL ARRANGEMENT

[75] Inventor: Wilfried Juergens, Munich, Fed. Rep. of Germany

[73] Assignee: Siemens Aktiengesellschaft, Berlin and Munich

[21] Appl. No.: 288,857

[22] Filed: Dec. 23, 1988

[30] Foreign Application Priority Data

Feb. 5, 1988 [DE] Fed. Rep. of Germany ....... 3803519

[51] Int. Cl.⁵ .................... H01L 31/05; H01L 31/075
[52] U.S. Cl. .................................. 136/249; 136/244; 136/258
[58] Field of Search ................. 136/244, 249 TJ, 246, 136/258 AM

[56] References Cited

U.S. PATENT DOCUMENTS

| | | | |
|---|---|---|---|
| 3,175,929 | 3/1965 | Kleinman | 136/255 |
| 4,316,049 | 2/1982 | Hanak | 136/244 |
| 4,387,265 | 6/1983 | Dalal | 136/249 |
| 4,591,892 | 5/1986 | Yamazaki | 357/30 |
| 4,737,196 | 4/1988 | Yokimoto | 136/249 |
| 4,784,701 | 11/1988 | Sakai et al. | 136/249 TJ |

FOREIGN PATENT DOCUMENTS

| | | | |
|---|---|---|---|
| 56-148874 | 11/1981 | Japan | 136/249 TJ |
| 57-187975 | 11/1982 | Japan | 136/249 TJ |
| 59-105379 | 6/1984 | Japan | 136/249 TJ |
| 63-122283 | 5/1988 | Japan | 136/249 TJ |

OTHER PUBLICATIONS

Patent Abstracts of Japan, vol. 7, No. 49 (E-161) (1194).
Patent Abstracts of Japan, vol. 8, No. 221 (E-271) (1658).
Patent Abstracts of Japan, vol. 9, No. 280 (E-356) (2003).
Heywang, *Amorphe und Polykristalline Halbleiter*, Springer-Verlage (1984), pp. 58–65.
Yang, *Current Status of Multijunction Devices Fabricated from Fluorinated Amorphous Silicon-Based Alloys*, International Conference on Stability of a–Si Alloy Materials and Devices, Jan. 28–30, 1987, pp. 295–303.
Pantoja-Lopez et al, *Experimental Photovoltaic Solar Plant*–100 kWp, Proc. 7th EPSEC 1986, pp. 137–141.
Eberspacher et al, *Design and Fabrication of Thin Film Si:H/Copper Indium Diselenide Tandem Modules*, 18th IEEE, Las Vegas (1985), pp. 1031–1035.
Uchida, *Light-Induced Degradation in Amorphous Silicon Solar Cells*, 7th E.C. Photovoltaic Solar Energy Conference, Oct. 27–31, 1986, pp. 395–401.
Extended Abstracts, vol. 86-1 (1986), *The Concept and the Applications of Bifacial Cells*.

Primary Examiner—Aaron Weisstuch
Attorney, Agent, or Firm—Hill, Van Santen, Steadman & Simpson

[57] ABSTRACT

A thin-film solar cell arrangement is provided. The thin-film solar cell contains at least two pin (nip) solar cells that are arranged relative to one another as a tandem cell, the neighboring layers of the two solar cells being of the same conductivity type. The two solar cells are interconnected to one another in a parallel circuit. The thin-film solar cell arrangement is suitable for module structure comprising series interconnection, whereby the parallel circuit of the respectively two solar cells in the tandem cell ensues together with the series interconnection.

3 Claims, 1 Drawing Sheet

THIN-FILM SOLAR CELL ARRANGEMENT

BACKGROUND OF THE INVENTION

The present invention is directed to a thin-film solar cell arrangement comprising at least one first solar cell and one second solar cell of the pin-type or nip-type that are arranged relative to one another as a tandem cell. Each cell comprises a p-layer, an i-layer, an n-layer, and electrical contacts. The thin-film cell is suitable for module structure with series interconnection W. Heywang, "Amorphe und polykristalline Halbleiter", Springer Verlag, Berlin, Heidelberg, New York, Tokyo 1984, pages 58 through 64, for example, discloses thin-film solar cells that contain what is referred to as a pin junction. An undoped, i.e., i-layer, is provided with a p-layer on one side and with an n-layer on an opposite side. The i-layer can be constructed based on amorphous silicon.

In order to be efficient, a solar cell of amorphous silicon must have a uniform and optimally high electrical field through the entire absorption zone. In this regard, it should be noted that the higher the electrical field strength in the i-layer, the less the solar cell ages. A higher field strength is achieved, for example, by utilizing a thinner i-layer. Only part of the incident light, however, is thereby still absorbed.

It is known to stack a plurality of series-interconnected pin-cells on top of one another; see, for example, W. Heywang, "Amorphe und polykristalline Halbleiter", Springer Verlag, Berlin, Heidelberg, New York, Tokyo 1984, page 64. This results in an increase in the absorption of the light. The no-load voltage of the arrangement is increased due to the series interconnection.

When two solar cells are stacked on top of one another, this is usually referred to as a tandem cell. Such a tandem cell is disclosed in, for example, J. Yang, International Conf. on Stability of a-Si Alloy Materials and Devices, 28-30 Jan. 87, Palo Alto, Calif., pages 295-303.

In order to better exploit the spectrum of incident light, two solar cells are combined in a tandem cell that absorb light in different wavelength ranges; see, for example, J. Yang, Intern. Conf. on Stability of a-Si Alloy Mat. and Devices, 28-30 Jan. 87, Palo Alto, Calif., pages 295-303. The differing wavelength sensitivity of solar cells is achieved by utilizing different additives to the amorphous silicon of the i-layer, such as, for example, carbon, germanium, or fluorine.

One of the difficulties that arises in creating tandem cells is matching the electrical values of the two cells that are stacked on top of one another and connected in series. In the series circuit, the overall voltage of the tandem cell of the arrangement is the sum of the individual voltages. The current in both individual solar cells in the tandem cell must be identical if losses are to be avoided. Matching the electrical values is achieved, for example, by matching the thicknesses of the two i-layers.

Another method (see, for example, C. Eberspacher et al, 18th IEEE, Las Vegas 1985, pages 1031-1035) is to produce the two solar cells so that they are completely insulated from each other, for example, on different sides of one substrate or on two substrates. Each solar cell can then be provided with two contacts that can be independently wired. But, locating the solar cells on the different sides of the substrate is an involved process and requires great care. The interconnection of the solar cells is extremely labor-intensive due to the many individual contacts.

SUMMARY OF THE INVENTION

The present invention provides a thin-film solar cell arrangement or device that is stable with respect to aging, simple to design, suitable for a module structure, and can be manufactured simply on a large industrial scale.

To this end, the present invention provides a thin-film solar cell arrangement comprising at least one first solar cell and one second solar cell of the pin-type or nip-type that are arranged relative to one another as a tandem cell. Each cell comprises a p-layer, an i-layer, an n-layer and contact layers or, respectively, electrical contactings. The thin-film solar cells are suitable for a module structure having series interconnection. The solar cells are arranged relative to one another, such that neighboring layers of the first solar and of the second solar cell are of the same conductivity type, and the p-layers of the first solar cell and of the second solar cell as well as the n-layers of the first solar cell and of the second solar cell are electrically connected to one another as a parallel circuit.

In an embodiment of the present invention, the i-layer of the first solar cell and the i-layer of the second solar cell are constructed of different intrinsic semiconductor materials that absorb light in different wavelength regions.

In an embodiment of the present invention, the i-layers of the first solar cell and of the second solar cell are provided on the basis of amorphous silicon; in that, for contacting the first solar cell and the second solar cell, a contact layer of electrically conductive material is respectively provided on that surface of the layer sequence facing away from the common layer and at least that contact layer facing toward the light is constructed from a transparent material.

In an embodiment the present invention, at least one of the n-layers and of p-layers is constructed from microcrystalline silicon.

In an embodiment of the present invention, an insulating layer is between the neighboring layers of the first solar cell and of the second solar cell.

In an embodiment of the present invention, the neighboring layers of first solar cell and of the second cell are a single common layer.

In an embodiment of the present invention a grid of transparent, conductive is provided on the common layer for promoting current derivation.

In an embodiment of the present invention a thin-film solar cell arrangement that contains a plurality of series-interconnected tandem cells is provided in that the parallel end connection of the respectively first solar cell and of the second solar cell in every tandem cell is provided together with the series interconnection.

Preferably, in an embodiment, the thin-film solar cell arrangement is characterized by the following features:
  (a) the tandem cells are contained in a layer format;
  (b) grooves that separate the individual tandem cells from another are provided in the layer format;
  (c) the grooves that extend perpendicularly relative to the layers respectively include a first step located at a first side wall of the grooves, the common layer lying at the surface of said first step;

(d) the first side wall of the groove is covered with an insulator layer that is structured such that it leaves the surface of the first step uncovered but covers all other layers;

(e) the grooves include a second step located at a second side wall, that lies opposite to the first side wall, the contact layer facing away from the surface of the layer format lying at the surface of the second step;

(f) the second side wall of the groove is covered with an insulator layer that is structured such that the contact layers are uncovered but all other layers are covered; and (g) the grooves are filled with an electrically conductive material.

In an embodiment of the thin-film solar cell arrangement, the insulator layers are replaced by a structure containing the contact layers, the structure is so constructed and arranged that a short between the common layer and one of the contact layers through the electrically conductive material is prevented.

In an embodiment of the present invention, both contact layers are constructed from a transparent, electrically conductive material.

In an embodiment of the present invention, the thin-film solar cell is utilized in a module whereby light incidence from both sides is exploited. Preferably, the thin-film solar cell arrangement is used in a module that is constructed in front of a reflecting background, whereby non-absorbed light is reflected at the background and again transirradiates the thin-film solar cell arrangement.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

Figure 1:
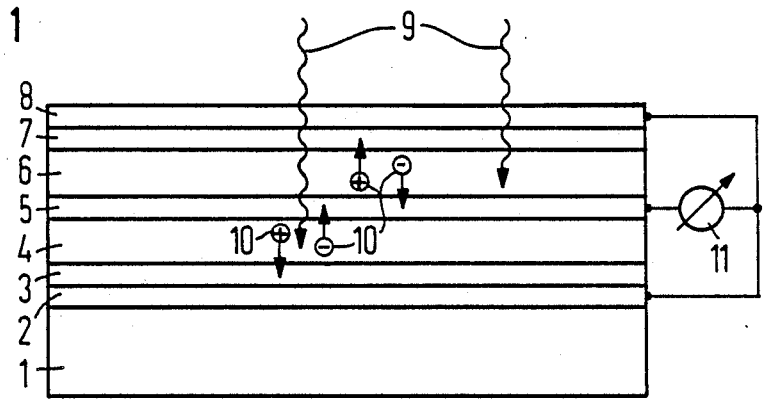
FIG. 1 illustrates a cross-sectional perspective view of a tandem cell of the present invention.

The present invention provides a thin-film solar cell arrangement of the species set forth above, wherein the solar cells are arranged in pairs relative to one another such that neighboring layers of the first solar cell and of the second solar cell are electrically connected to one another in a parallel circuit.

This device has the advantage of increased stability with respect to its aging behavior because the layers can be thin; less than or equal to 0.2 $\mu$m. The electrical voltages at the two solar cells are the same. Moreover, the interconnection of the two solar cells corresponds to a parallel circuit. The currents in the cells can therefore be arbitrary without reducing the efficiency of the device. Matching the two cells in such a device is therefore very simple.

In order to better exploit the spectrum or incident light, intrinsic semiconductor material having different additives that absorb light at different wavelength regions are used for the i-layers of the first solar cell and of the second solar cell. When, for example, the i-layers are based on hydrogenated, amorphous silicon, for example, carbon, germanium, and fluorine can be used as the additives.

It can be advantageous to construct the neighboring layers of the first solar cell and of the second solar cell as a double layer. For example, this can be done when the second solar cell is to be manufactured in a different system than the first. By utilizing different materials in the two solar cells, potential difficulties can be avoided in that an insulation layer is provided between the neighboring layers. The device then has four terminals.

An extremely simple structure of the arrangement is achieved in that the neighboring layers of the first solar cell and of the second solar cell, that are of the same conductivity type, pursuant to the present invention can be constructed as a single, common layer.

The current derivation of the common layer is improved in that a grid of transparent, electrically conductive material, for example, ITO (indium-tin-oxide), is provided on the common layer.

For contacting the solar cell device comprising i-layers on based on amorphous silicon, contact layers must be respectively provided on the surface of the layer sequence of the solar cells that faces away from the common layer. At least one of the contact layers, through which the light incidence proceeds, is composed of transparent, electrically conductive material. The contacting, via contact layers, provides a good current derivation. The application of contact layers is technologically simpler in the manufacturing process than the application of individual electrodes.

When both contact layers are composed of transparent, electrically conductive material, light incident on both sides of the solar cell device can be utilized.

The light that is not absorbed in the thin-film solar cell device, and that is reflected back into the thin-film solar cell device at the surface behind the thin-film solar cell device can be further utilized for generating currant (what are referred to as bifacial cells; see, for example, A. Pantoja-Lopez, J. Garcia Martin, 7th E.C.P.V.-S.E.C., Seville/Spain 1986, pages 137–141).

From a technological standpoint, it is simpler to provide a parallel interconnection of the two solar cells in every tandem cell in combination with the series interconnection in a module format. It is also technologically desirable to provide the thin-film solar cell device in a layer format. To this end, the layer format comprises a layer sequence of: a first p-conductive; a first intrinsic; a common n-conductive; a second intrinsic; and a second p-conductive layer. The first p-conductive layer and the second p-conductive layer are each bordered by a contact layer.

The individual tandem cells, in a layer format, are separated from each other by grooves. The side walls of the grooves extend perpendicularly to the layer format and are each covered with a structured insulator layer such that the common n-conductive layer is exposed at the one side wall and the two contact layers are exposed at the other, opposite side wall. The groove is filled with an electrically conductive material. As a result of the structuring of the insulator layers, the conductive material electrically connects the common n-conductive layer of the one tandem cell to the contact layers and, therefore, to the p-conductive layers of the following tandem cell.

The structuring of the insulator layers is achieved, for example, by etching steps into the side walls of the groove. The common n-conductive layer or, respectively, the contact layers are located at the surface of the steps. The steps can be produced, for example, by selective etching. To this end, it is desirable to construct the n-conductive or p-conductive layers from microcrystalline silicon.

In an embodiment of the present invention, a layer format is provided having a layer sequence comprising an n-conductive, an intrinsic, a common p-conductive, an intrinsic, and an n-conductive layer.

Referring now to FIG. 1, a tandem cell of the present invention is illustrated. As illustrated, the cell includes a first contact layer 2, a first p-layer 3, a first i-layer 4, a common n-layer 5, a second i-layer 6, a second p-layer 7, and a second contact layer 8 are provided on a substrate 1 composed, for example, of glass. The first contact layer 2 and the second contact layer 8 are composed of a transparent, conductive material, for example of doped $SnO_2$. The first p-layer 3 and the second p-layer 7 are composed of amorphous silicon and are p-conductive due to doping with boron.

The first i-layer 4 and the second i-layer 6 are intrinsic layers. The first i-layer 4 is composed of amorphous silicon-germanium. The second i-layer 6 is composed of amorphous silicon. The common n-layer 5 is composed, for example, of microcrystalline silicon and is n-conductive due to doping with phosphorus.

Preferably, the layers of the tandem cell have the following thicknesses: approximately 15 to about 20 nm for the first p-layer 3; approximately 100 to about 250 nm for the first i-layer 4; approximately 20 to about 40 nm for the common n-layer 5; approximately 300 to about 700 nm for the second i-layer 6; and approximately 15 to about 20 nm for the second p-layer 7.

During operation of the tandem cell illustrated in FIG. 1, light, indicated by arrows 9, is beamed into the tandem cell from the side of the cell having the second contact layer 8. The light is partially absorbed in the first i-layer 4 and partially absorbed in the second i-layer 6. Charge carriers 10 are thereby produced. Due to the electrical field, the charge carriers are attracted to the common n-layer 5 or, respectively, to the first p-layer 3 or to the second p-layer 7 pursuant to their polarity. The common n-layer 5 is electrically connected to the first p-layer 3 to the second p-layer 7 via a load 11.

Figure 2:
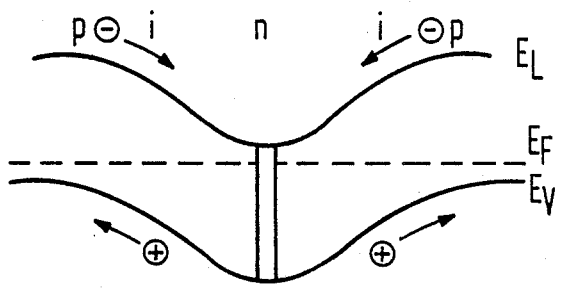
FIG. 2 illustrate schematically the course of the potential in a tandem cell.

Referring now to FIG. 2, there is schematically illustrated the course of the potential in the tandem cell. The course of the potential is along a section that extends perpendicularly relative to the layer sequence in FIG. 1 FIG. 2 also illustrates how the charge transport proceeds on the basis of electrons and holes.

Figure 3:
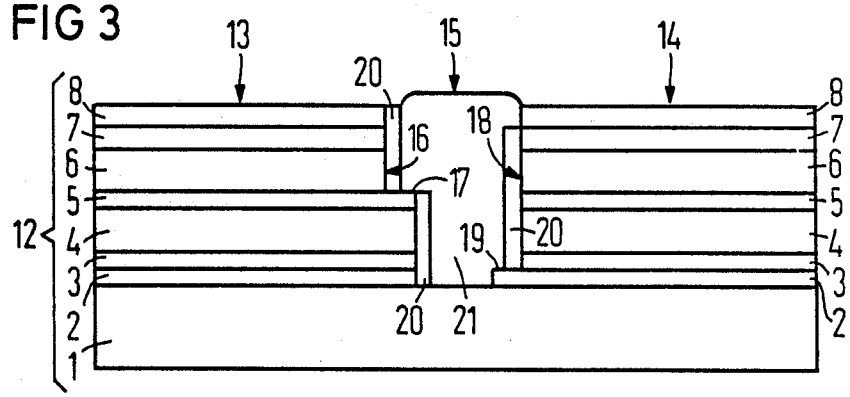
FIG. 3 illustrates series-interconnected solar cells of the present invention.

Referring now to FIG. 3, two series-connected tandem cells that are contained in a layer format 12, are illustrated. As illustrated, the layer format 12 contains the substrate 1, the first contact layer 2, the first p-layer S, the first i-layer 4, the common n-layer 5, the second i-layer 6, the second p-layer 7, and the second contact layer 8.

In the layer format 12, a first tandem cell 13 and a cell 14 are separated by a groove 15. The groove 15 extends perpendicularly relative to the layer format down to the substrate 1. A first side wall 16 of the groove 15 comprises a first step 17. The first side wall 16 limits the first tandem cell 13. The first step 17 proceeds along the surface of the common n-layer 5. A second side wall 18 of the groove 15 that lies opposite the first side wall 16 and limits the second tandem cell 14 comprises a second step 19. The second step 19 proceeds at the surface of the first contact layer 2.

The first side wall 16 and the second side wall 18 are each covered with a structured insulator layer 20. The insulator layers 20 are structured such that all layers except for the common n-layer 5 are covered at the first side wall 16 and such that all layers except for the first contact layer 2 and the second contact layer 8 are covered at the second side wall 18. The groove 15 is filled with electrically conductive material 21.

Due to the structuring of the insulator layers 20, the electrically conductive material 21 connects the common n-layer 5 at the first side wall 16 to the first contact layer 2 and to the second contact layer 8 at the second side wall 18. As a result thereof, the common n-layer 5 of the first tandem cell 13, is electrically connected to the first p-layer 3 and to the second p-layer 7 of the second tandem cell 14.

On the basis of a multiple repetition of the connection between the two tandem cells set forth with reference to FIG. 3, a module comprising many tandem cells ensures that the tandem cells are serially interconnected and simultaneously guarantees that the solar cells contained in the tandem cells are interconnected in parallel.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I CLAIM:

1. A thin-film solar cell device comprising at least one first solar cell and one second solar cell of the pin-type or nip-type that are arranged relative to one another as a tandem cell, each comprising a p-layer, an i-layer, an n-layer, and contact layers suitable for a module structure comprising series interconnection, wherein the first and second solar cells are located relative to one another such that neighboring layers of the first solar cell and of the second solar cell are of the same conductivity type and are provided as a single, common layer; p-layers of the first solar cell and of the second solar cell, as well as n-layers of the first solar cell and of the second solar cell, are electrically connected to one another in a parallel circuit, and further including a plurality of series-interconnected tandem cells of such construction, wherein the first solar cell and the second solar cell in every tandem cell includes a parallel end connection provided with the means for providing series interconnection, and wherein:

(a) the tandem cells are provided in a layer format;
(b) grooves that separate the individual tandem cells from another are provided in the layer format;
(c) the grooves extend perpendicularly relative to the layers and comprise a first step at a first side wall of the groove, said common layer lying at a surface of said first step;
(d) the first side wall of the groove is covered with an insulator layer that is structured such that it leaves the surface of the first step uncovered but covers all other layers;
(e) the grooves further comprise a second step at a second side wall that lies opposite the first side wall, the contact layer facing away from the surface of the layer format lying at a surface of said second step;
(f) the second side wall of the groove is covered with an insulator layer that is structured such that the contact layers are uncovered but all other layers are covered; and (g) the grooves are filled with an electrically conductive material which provides electrical conduction between said common layer and said contact layers.

2. The thin-film solar cell device of claim 1 wherein at least the common layer is constructed from microcrystalline silicon.

3. A thin-film solar cell device comprising a plurality of series-interconnected tandem cells, each tandem cell comprising at least one first solar cell and one second solar cell of the pin-type or nip-type that are arranged one above the other, each solar cell comprising a p-layer, an i-layer, an n-layer, and a contact layers, wherein:

the first and second solar cells are located relative to one another such that neighboring layers of the first solar cell and of the second solar cell are of the same conductivity type and are provided as a single common layer;

p-layers of the first solar cell and of the second solar cell, as well as n-layers of the first solar cell and of the second solar cell, are electrically connected to one another in a parallel circuit;

a parallel end connection of the first solar cell and of the second solar cell in every tandem cell includes means for providing the series interconnection; and wherein:

(a) the tandem cells are provided in a layer format;

(b) grooves that separate the individual tandem cells from another are provided in the layer format;

(c) the grooves extend perpendicularly relative to the layers respectively comprise a first step at a first side wall of the groove, said common layer lying at a surface of said first step;

(d) the first side wall of the groove is covered with an insulator layer that is structured such that it leaves the surface of the first step uncovered but covers all other layers;

(e) the grooves further comprise a second step at a second side wall that lies opposite the first side wall, the contact layer facing away from the surface of the layer format lying at a surface of said second step;

(f) the second side wall of the groove is covered with an insulator layer that is structured such that the contact layers are uncovered but all other layers are covered; and (g) the grooves are filled with an electrically conductive material which provides electrical conduction between said common layer and said contact layers.

* * * * *